(12) United States Patent
Robin et al.

(10) Patent No.: US 12,185,492 B2
(45) Date of Patent: Dec. 31, 2024

(54) ELECTROSTATIC CADDY INDICATOR

(71) Applicant: SOFTIRON LIMITED, Chilworth (GB)

(72) Inventors: Sean Michael Robin, San Jose, CA (US); George Brandon Dunson, Melissa, TX (US)

(73) Assignee: SOFTIRON LIMITED, London (GB)

( * ) Notice: Subject to any disclaimer, the term of this patent is extended or adjusted under 35 U.S.C. 154(b) by 53 days.

(21) Appl. No.: 18/323,644

(22) Filed: May 25, 2023

(65) Prior Publication Data

US 2023/0389217 A1    Nov. 30, 2023

Related U.S. Application Data

(60) Provisional application No. 63/345,998, filed on May 26, 2022.

(51) Int. Cl.
| | |
|---|---|
| *G06F 1/16* | (2006.01) |
| *H05K 5/00* | (2006.01) |
| *H05K 7/00* | (2006.01) |
| *H05K 7/14* | (2006.01) |

(52) U.S. Cl.
CPC .................................. *H05K 7/1494* (2013.01)

(58) Field of Classification Search
CPC .. H05K 7/1494; H05K 7/1488; H05K 7/1485; H05K 7/1498; H05K 7/1481
See application file for complete search history.

(56) References Cited

U.S. PATENT DOCUMENTS

| | | | |
|---|---|---|---|
| 6,295,566 B1* | 9/2001 | Stufflebeam | G06F 13/4081 713/324 |
| 10,966,339 B1* | 3/2021 | Gardner | H05K 7/023 |
| 11,523,533 B1* | 12/2022 | Rivnay | G09G 3/14 |
| 2004/0236463 A1* | 11/2004 | Weselak | G11B 15/6835 700/214 |
| 2015/0026515 A1* | 1/2015 | Arnouse | H05K 7/20736 714/10 |
| 2017/0329736 A1* | 11/2017 | Yu | G06F 3/0683 |
| 2022/0283960 A1* | 9/2022 | Long | G06F 13/4221 |
| 2022/0334621 A1* | 10/2022 | O'Donnell | G06F 11/3055 |
| 2023/0222032 A1* | 7/2023 | Jenkinson | G06F 11/076 714/764 |
| 2023/0389217 A1* | 11/2023 | Robin | H05K 7/1494 |

* cited by examiner

*Primary Examiner* — Anthony M Haughton
(74) *Attorney, Agent, or Firm* — Slayden Grubert Beard PLLC

(57) ABSTRACT

A tray for modules may be configured to be in power communication with a motherboard. The tray may include a tray status indicator to be powered by a power storage circuit within the tray when the tray is disconnected from the motherboard. The tray may include slots to receive removable modules that are to be in power communication with the tray. The tray may include module status indicators to be powered by the power storage circuit when the tray is disconnected from the motherboard. The tray may include an indicator that a given one of the removable modules has a fault. The indication is to be persistent after disconnection of the tray from the motherboard. The tray may include a display controller circuit to selectively apply display schemes for the tray status indicator and the module status indicators depending upon whether the tray is connected to power of the motherboard.

22 Claims, 14 Drawing Sheets

| Display Data Set 1 | Display Data Set 2 | ... | Display Data Set n |
|---|---|---|---|
| Display Mode 1 | Display Mode 2 | ... | Display Mode n |
| Power Level Mode 1 | Power Level Mode 2 | ... | Power Level Mode n |
| Timing Mode 1 | Timing Mode 2 | ... | Timing Mode n |

| Removable Module 112 Condition | | Intelligent Module Tray Connected — Visual Display Device 130 | Intelligent Module Tray Disconnected Power 100% — Visual Display Device 130 | Intelligent Module Tray Disconnected Power 75% — Visual Display Device 130 | Intelligent Module Tray Disconnected Power 50% — Visual Display Device 130 | Intelligent Module Tray Disconnected Power 25% — Visual Display Device 130 |
|---|---|---|---|---|---|---|
| Removable Storage Device - Fully Operational | Display Mode | State A | OFF | OFF | OFF | OFF |
| | Power Mode | 100% | 100% | 100% | 100% | 100% |
| | Display Timing | 0 | 0 | 0 | 0 | 0 |
| Removable Storage Device - Device Not Responding | Display Mode | State A | State A / OFF | State A / OFF | State A / OFF | State A / OFF |
| | Power Mode | 100% | 100% / 100% | 90% / 100% | 70% / 100% | 25% / 100% |
| | Display Timing | 1Sec | 500mS 4Sec | 400mS 4.5Sec | 300mS 5Sec | 200mS 5.5Sec |
| Removable Storage Device - Failure Detected | Display Mode | State C | State C / OFF | State C / OFF | State C / OFF | State C / OFF |
| | Power Mode | 100% | 100% / 100% | 90% / 100% | 70% / 100% | 25% / 100% |
| | Display Timing | 1Sec | 500mS 4Sec | 400mS 4.5Sec | 300mS 5Sec | 200mS 5.5Sec |
| Removable Storage Device - Upgrade Required | Display Mode | State B | State B / OFF | State B / OFF | State B / OFF | State B / OFF |
| | Power Mode | 100% | 100% / 100% | 90% / 100% | 70% / 100% | 25% / 100% |
| | Display Timing | 1Sec | 500mS 4Sec | 400mS 4.5Sec | 300mS 5Sec | 200mS 5.5Sec |
| Multiport Network Interface Device - Fully Operational | Display Mode | State A | OFF | OFF | OFF | OFF |
| | Power Mode | 100% | 100% | 100% | 100% | 100% |
| | Display Timing | 0 | 0 | | | |
| Multiport Network Interface Device - Single Port Failure | Display Mode | State A / OFF | State A / OFF | | | |
| | Power Mode | 100% / 100% | Logarithmic M=1.0 | | | |
| | Display Timing | 1Sec / 2Sec | | | | |
| Multiport Network Interface Device - All Port Failure | Display Mode | State B / OFF | State B / OFF | State C / OFF | | |
| | Power Mode | 100% / 100% | Linear M=0.48 | Logarithmic M=1.0 | | |
| | Display Timing | 1Sec / 2Sec | | | | |
| Multiport Network Interface Device - Upgrade Required | Display Mode | State B / OFF | State B / OFF | State A / OFF | | |
| | Power Mode | 100% / 100% | Linear M=0.48 | Logarithmic M=1.0 | | |
| | Display Timing | 1Sec / 2Sec | | Linear M=0.48 | | |

| Intelligent Module Tray Condition - Action Required | | Intelligent Module Tray Connected | | Intelligent Module Tray Disconnected Power 100% | | Intelligent Module Tray Disconnected Power 75% | | Intelligent Module Tray Disconnected Power 50% | | Intelligent Module Tray Disconnected Power 25% | |
|---|---|---|---|---|---|---|---|---|---|---|---|
| | | Visual Display Device 132 | | Visual Display Device 132 | | Visual Display Device 132 | | Visual Display Device 132 | | Visual Display Device 132 | |
| No Failed Removable Modules | Display Mode | State A | | OFF | | OFF | | OFF | | OFF | |
| | Power Mode | 100% | | 100% | | 100% | | 100% | | 100% | |
| | Display Timing | 0 | | 0 | | 0 | | 0 | | 0 | |
| One or more Failed Modules | Display Mode | State A | OFF | State A | OFF | State A | OFF | State A | OFF | State A | OFF |
| | Power Mode | 100% | 100% | 100% | 100% | 90% | 100% | 70% | 100% | 100% | 25% |
| | Display Timing | 1Sec | 1Sec | 500mS | 4Sec | 400mS | 4.5Sec | 300mS | 5Sec | 200mS | 5.5Sec |
| One or more Modules for Upgrade | Display Mode | State B | OFF | State B | OFF | State B | OFF | State B | OFF | State B | OFF |
| | Power Mode | 100% | 100% | 100% | 100% | 90% | 100% | 70% | 100% | 100% | 25% |
| | Display Timing | 1Sec | 1Sec | 500mS | 4Sec | 400mS | 4.5Sec | 300mS | 5Sec | 200mS | 5.5Sec |
| One or more Failed and one or more Upgrade | Display Mode | State A | OFF | State C | OFF | State C | OFF | State C | OFF | State C | OFF |
| | Power Mode | 100% | 100% | 100% | 100% | 90% | 100% | 70% | 100% | 100% | 25% |
| | Display Timing | 1Sec | 2Sec | 500mS | 4Sec | 400mS | 4.5Sec | 300mS | 5Sec | 200mS | 5.5Sec |

| Intelligent Module Tray Condition - Power Level | | Visual Display Device 134 | Visual Display Device 134 | Visual Display Device 134 | Visual Display Device 134 | Visual Display Device 134 |
|---|---|---|---|---|---|---|
| No Failed Removable Modules | Display Mode | State A | State B OFF | State B OFF | State B OFF | State C OFF |
| | Power Mode | 100% | 100% 100% | 90% 100% | 70% 100% | 100% 25% |
| | Display Timing | 0 | 500mS 4Sec | 400mS 4.5Sec | 300mS 5Sec | 200mS 5.5Sec |

FIG. 12

ELECTROSTATIC CADDY INDICATOR

PRIORITY

This application claims priority to U.S. Provisional Patent Application No. 63/345,998 filed May 26, 2022, the contents of which are hereby incorporated in their entirety.

FIELD OF THE INVENTION

The present disclosure relates to electronic device servers and, more particularly, an electrostatic-powered visual indicator on a removable module tray or caddie.

BACKGROUND

Electronic equipment may contain modules that can be removed and replaced, such as caddies or removable module trays. Further, in many cases these modules can be removed while the main body of the equipment is still powered on. In the case of some equipment configurations, such as rack mounted servers, modules can be replaced while the equipment is still installed. Inventors of embodiments of the present disclosure have discovered that to aid the identification of modules that are to be removed, visual indicators may be used to indicate the necessity for removal. Inventors of embodiments of the present disclosure have discovered that, in certain circumstances it may advantageous to have the visual indicators remain active when the module has been removed from the main assembly.

In such cases it may be common to use a local power source to maintain the functionality of the visual indicators. Because of their power density, batteries are often used to provide a local power source for this purpose. However, batteries have certain limitations. In the event of a containment failure, corrosive chemicals can severely damage the equipment in which they are housed. Batteries have a finite lifetime and need to be replaced, often several times within the lifetime of the equipment.

Electrostatic devices, e.g., specialized capacitors, can be used as a power source. Unfortunately, their energy density is not comparable with chemical alternatives. So, although they have a longer lifetime and are less risky, they are not used for this type of application due to their limited energy storage capacity.

Inventors of the present disclosure have discovered that this type of storage can be used as an energy source for visual displays by optimizing the power source and judiciously controlling the power used by the visual display. Embodiments of the present disclosure address one or more of these issues.

BRIEF DESCRIPTION OF THE DRAWINGS

The figures illustrate example flows and systems for intelligent module trays having multiple removable modules, wherein each intelligent module tray has electrostatic-powered visual indicators to signal the internal status of the intelligent tray module and to identify removable modules that need to be replaced.

FIG. 7 shows display data sets constructed using display data elements, including display mode, display power level, and display timing, according to embodiments of the present disclosure.

FIG. 11 illustrates an example of sequencing for two different removable modules, according to embodiments of the present disclosure.

FIG. 12 shows an example of the sequencing for an intelligent module tray, according to embodiments of the present disclosure.

The reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Electronic device servers may include intelligent module trays having multiple removable modules, wherein each intelligent module tray has electrostatic-powered visual indicators to signal the internal status of the intelligent tray module and to identify removable modules that need to be replaced.

Figure 1:
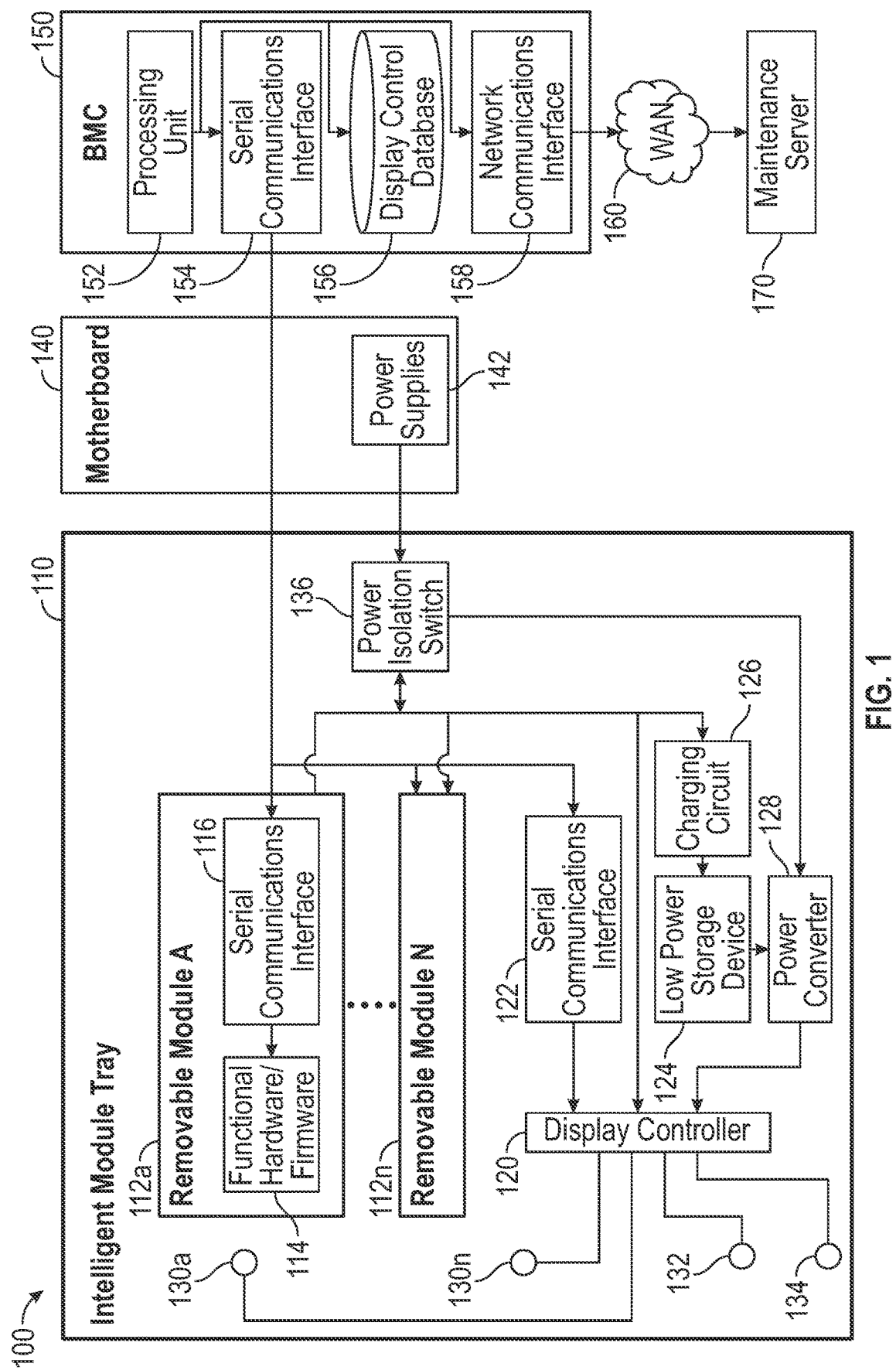
FIG. 1 is an illustration of a system diagram of a motherboard, a baseboard management controller, and an intelligent module tray, according to embodiments of the present disclosure.

FIG. 1 shows an overview of an example electronic system 100 that includes a motherboard 140, baseboard management controller (BMC) 150, and an intelligent module tray 110, according to embodiments of the present disclosure. For clarity, only some components of motherboard 140 and BMC 150 might be shown. System 100 may include any suitable number of intelligent module trays 110.

Intelligent module tray 110 can house multiple removable modules 112. Modules 112 may be implemented in any suitable manner. Each removable module 112 may contain any suitable functional hardware/firmware 114 to provide a subset of the overall operational infrastructure of system 100. Functional hardware/firmware 114 may include any suitable components, such as storage media devices, network interface devices, data transcoding devices, graphical processing units (GPUs), or local communications interfaces (e.g., USB). Removable modules 112 may also contain a serial communications interface 116 configured to connect, via motherboard 140, to serial communications interface 154 in BMC 150 to provide a communications channel. Power may be supplied to removable modules 112 from power supplies 142 in motherboard 140 via a power isolation switch 136. In the event intelligent module tray 110 is physically disconnected from motherboard 140, then no power may be supplied to tray 110 from power supplies 142.

Power supplies 142 may be implemented in any suitable manner, such as by a persistent power source such as a battery, or by electrical AC or DC power provided by a facility. Power isolation switch 136 may be implemented in any suitable manner, such as by passively using a mechanical switch as part of the connector assembly, actively using an electromechanical relay, or analog circuitry. Power isolation switch 136 may be configured to divert residual power from removable modules 112 to power converter 128. Power isolation switch 136 may so divert power from removable modules 112 to power converter 128 when tray 110 is disconnected from power supplies 142. Alternatively, when intelligent module tray 110 is connected to motherboard 140, power isolation switch 136 may direct power from power supplies 142 to removable modules 112, charging circuit 126, serial communications interface 122, and a display controller 120. This connection path (directing power from power supplies 142 to removable modules 112, charging circuit 126, serial communications interface 122, and display controller 120) may be established by power isolation switch 136 if input power from power supplies 142 is detected.

Intelligent module tray 110 may include a display controller 120, implemented in any suitable manner such as by analog circuitry, digital circuitry, a field programmable gate array (FPGA), an application-specific integrated circuit (ASIC), instructions for execution by a processor, or any suitable combination thereof. Display controller 120 may be configured to control any suitable number and kind of display indicators, such as indicators 130, 132, 134. Display indicators 130 may be a set of n display indicators. Each such display indicator 130 may be associated with a corresponding, specific removable module 112. Further visual indicators 132, 134 may be independent of removable modules 112. Display controller 120 and associated visual display indicators 130, 132, 134 may be powered from power supplies 142 via power isolation switch 136 when tray 110 is connected to motherboard 140, and via removable modules 112 when tray 110 is not connected to motherboard 140. Display controller 120 may be configured to activate any suitable indicators as described in the present disclosure based upon various conditions, such as available power, whether modules are functional or require attention or have failed, or whether tray 110 is connected to motherboard 140 and power supplies 142.

Tray 110 may include a charging circuit 126, implemented in any suitable manner to charge a low power storage device 124. Device 124 may be implemented in any suitable manner to store energy, such as a battery or capacitor. Device 124 may be used to power displays on tray 110 when tray 110 is disconnected from motherboard 140 or, more particularly, power supplies 142. Device 124 may be charged by charging circuit 126 when tray 110 is connected to power supplies 142. Power isolation switch 136 may be configured to selectively determine whether displays of tray 110 are to be powered by device 124 within tray 110 (such as when tray 110 is disconnected from motherboard 140 and power supplies 142) or powered by power supplies 142 (such as when tray 110 is connected to motherboard 140 and power supplies 142). In either case, the power provided by device 124 or power supplies 142 may be regulated by a power converter 128, which may be implemented in any suitable manner so as to match power requirements therefrom.

Figure 2:
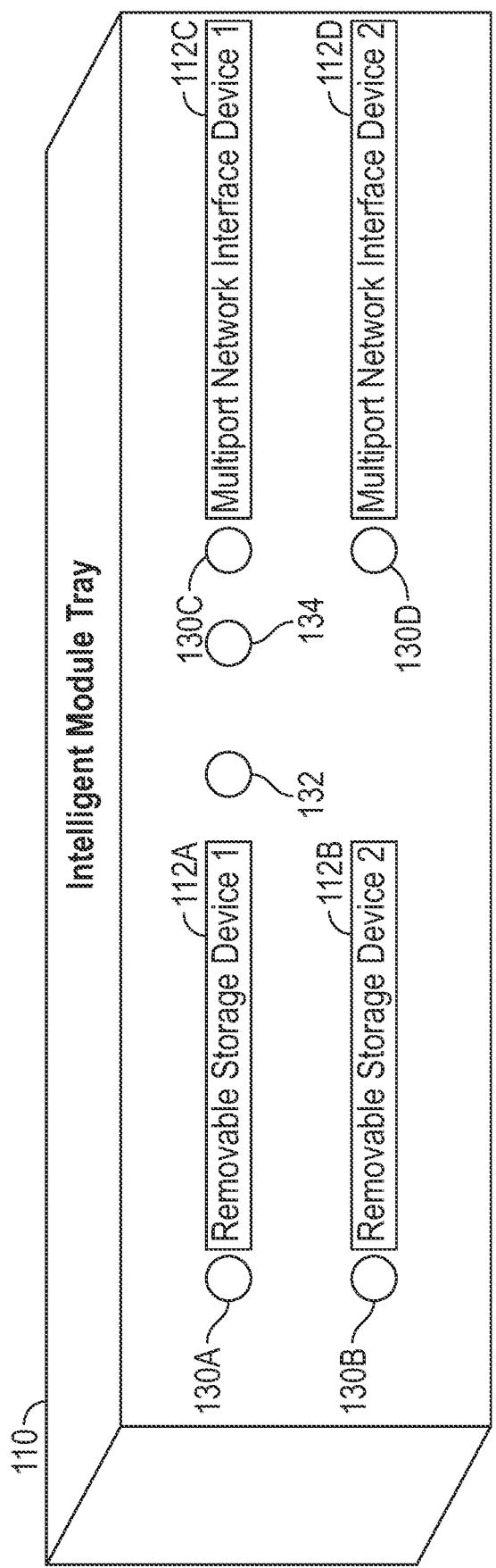
FIG. 2 is an illustration of an example intelligent module tray or caddie, according to embodiments of the present disclosure.

FIG. 2 shows an example instance of intelligent module tray 110, according to embodiments of the present disclosure. As shown above, tray 110 may include visual indicators 132, 134, which may be independent of removable modules. Tray 110 may include example removable modules 112A, 112B, 112C, 112D, which may be respectively associated with visual display indicators 130A, 130B, 130C, 130D. For example, intelligent module tray 110 may contain two removable storage devices—represented by module 112A and module 112B—and two removable multiport network interface devices—represented by module 112C and module 112D. Although not shown, additional module slots in tray 110 might not currently contain a module. The tray may be removed to add additional modules to alter the overall capability of electronic system 100.

In one example scenario, module 112A, a removable storage device, may be operating normally. Module 112B, another removable storage device, may need to be upgraded. Module 112C, a multiport network interface device, may be operating normally. Module 112D, another multiport network interface device, may have an all port failure. Intelligent module tray 110 may have a configuration wherein visual display indicators 130 are implemented with multi-color LEDs or other indicators to appropriately illustrate these and other different states.

Figure 3A:
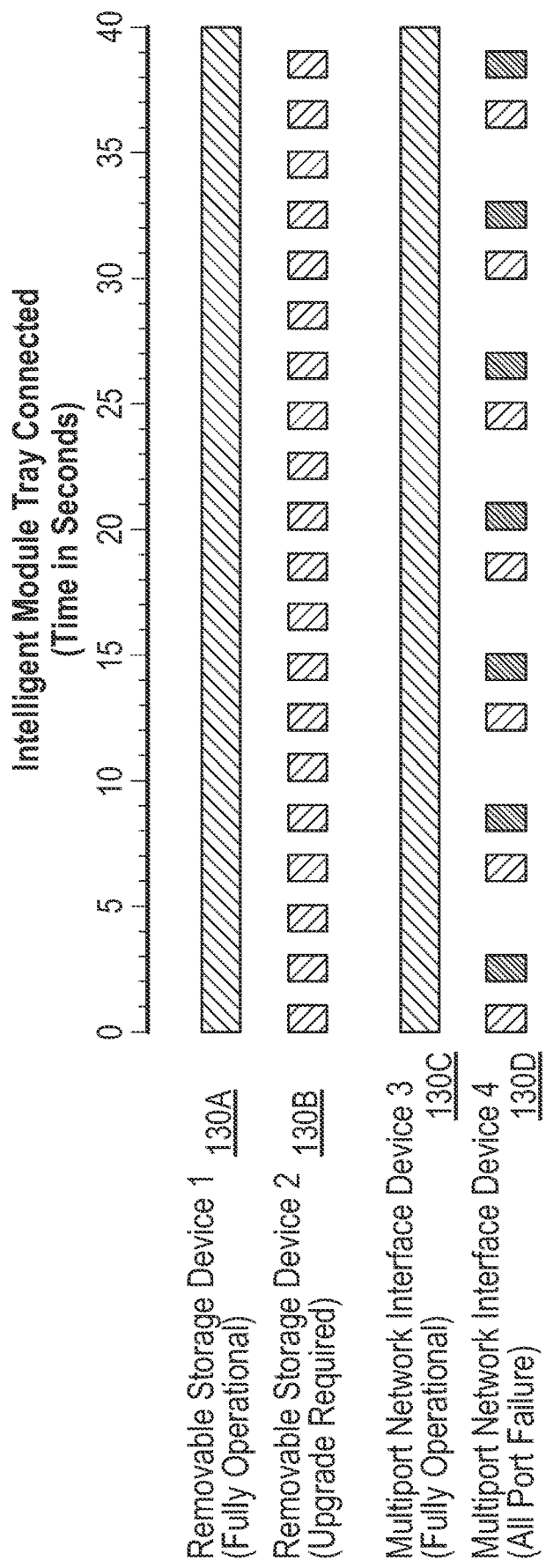
FIG. 3A illustrates states for visual display indicators of individual removable modules when the intelligent module tray is connected to the motherboard, according to embodiments of the present disclosure.

FIG. 3A illustrates states for visual display indicators of individual removable modules when intelligent module tray 110 is connected to motherboard 140 or otherwise powered by power supplies 142, according to embodiments of the present disclosure.

When a module is fully operational (such as removable module 112A (removable storage device 1) in the example scenario) is fully operational, state A may be indicated on the respective visual display indicator 130 for the device (such as indicator 130A in the example scenario). State A may include, for example, a solid, persistent and non-flashing color such as green when tray 110 is connected to motherboard 140 or otherwise powered by power supplies 142.

When a module requires an upgrade or any other service or attention (such as removable module 112B (removable storage device 2) in the example scenario), state B may be indicated on the respective visual display indicator 130 (such as indicator 130B). State B may include, for example, flashing the indicator on and off every time period. The ON and OFF parts of the time period may be approximately equal, such as within 20% of each other, such as when the indicator is ON for one second and OFF for one second. State B may include a color that is different from state A, such as orange or yellow. These operations of state B may be for when tray 110 is connected to motherboard 140 or otherwise powered by power supplies 142.

In the example scenario, removable module 112C (multiport network interface device 1) may be fully operational, and so state A may be indicated on visual display indicator 130C for the device.

When a module has a failure, state C may be used. Moreover, in some embodiments, state C may use elements of state B. State C may be a third color separate from state B, and may also be different than state A, though in some embodiments, state C may be a same color as state A. State B and state C may be alternatively indicated on the respective indicator 130. Moreover, in some embodiments, an OFF state of indicator 130 may be used in alternation with states B and C. Thus, for example, a series of flashing state A for one second, OFF for on second, state B for one second, OFF for three seconds, and then repeating the flashing of state A may be performed. In the example scenario, when removable module 112D (multiport network interface device 2) experiences an all-port failure, states B, C, and OFF may be alternately indicated as described above.

Figure 3B:
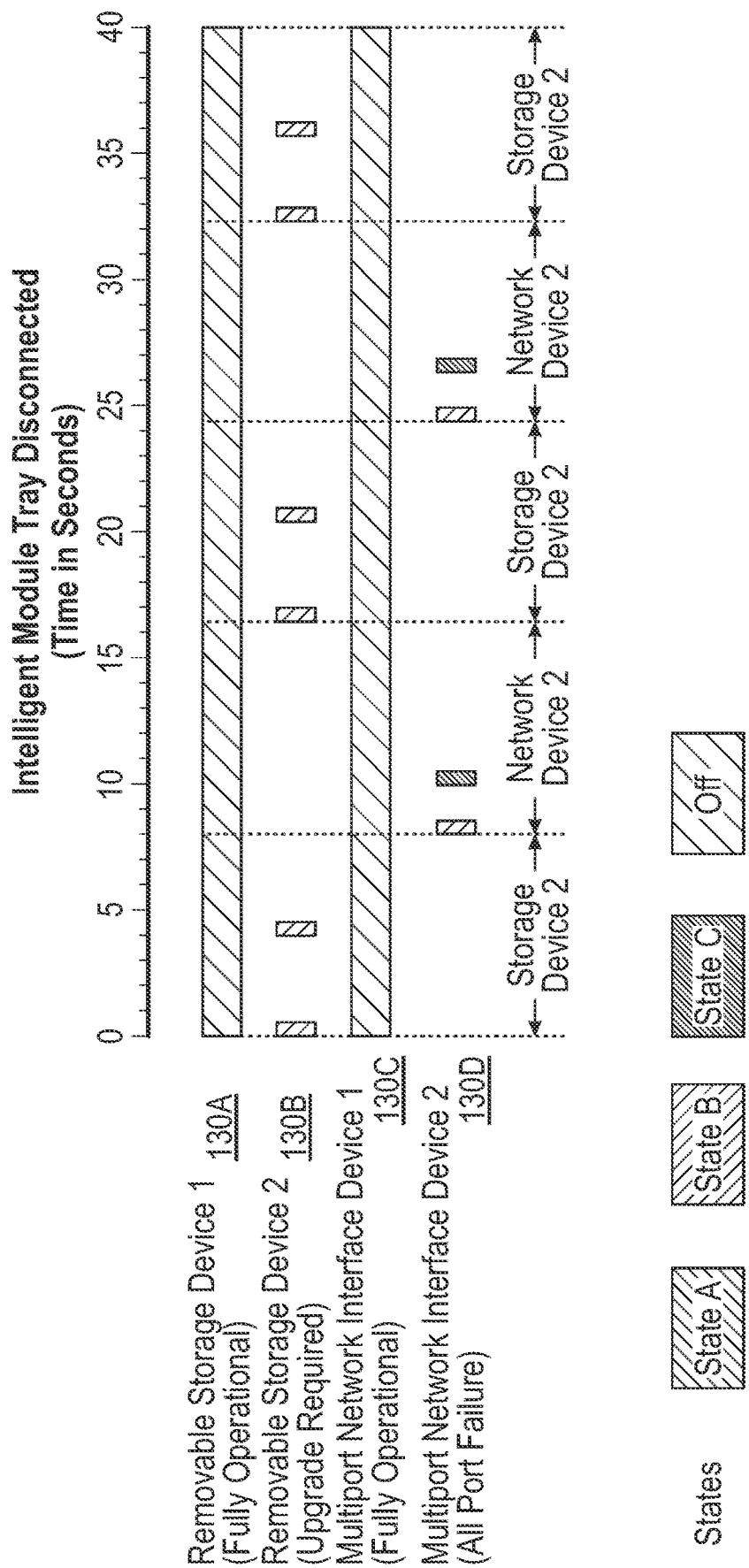
FIG. 3B illustrates states for visual display indicators of individual removable modules when the intelligent module tray is disconnected from the motherboard, according to embodiments of the present disclosure.

In contrast, FIG. 3B illustrates counterpart states for visual display indicators of individual removable modules when intelligent module tray 110 is disconnected from the motherboard 140 and power supplies 142, according to embodiments of the present disclosure. Power isolation switch 136 may route power to the displays using low power storage device 124 via power controller 128 and display controller 120.

When a module is fully operational (such as removable module 112A (removable storage device 1) in the example scenario) is fully operational, state A may be indicated on the respective visual display indicator 130 for the device (such as indicator 130A in the example scenario). State A may include, for example, being OFF on visual display indicator 130A for the device. An observer of tray 110 may understand the respective device for an indicator 130 that is OFF to nonetheless be fully operational by, for example, the presence of other indications that tray 110 is operating, such as by other indicators for tray 110 generally. Since the operational modules might not require any attention, turning off the displays might not significantly impact their functionality, but will remove load from the low power storage device 124 and extend the duration of available power.

When a module requires an upgrade or any other service or attention (such as removable module 112B (removable storage device 2) in the example scenario), state B may be indicated on the respective visual display indicator 130 (such as indicator 130B). State B may be indicated on the respective indicator 130 by flashing state B on and off. This may be done, for example, by flashing ON in state B for one second, OFF for four seconds, ON for one second, and OFF for eleven seconds, then repeating. Changing the ON and OFF times of the displays might not significantly hinder their functionality, but may remove load from the low power storage device 124 and extend the duration of available power.

When removable module 112C (multiport network interface device 1) is fully operational, OFF may be indicated on visual display indicator 130 for the device.

When a module has a failure, such as removable module 112C (multiport network interface device 2) experiencing an all port failure, states B and C and OFF may be alternately flashed on visual display indicator 130C for the device—state B for one second, OFF for two seconds, state C for one second, OFF for thirteen seconds, and then the cycled repeated. As described above, state A may be reused for state C.

Figure 4A:
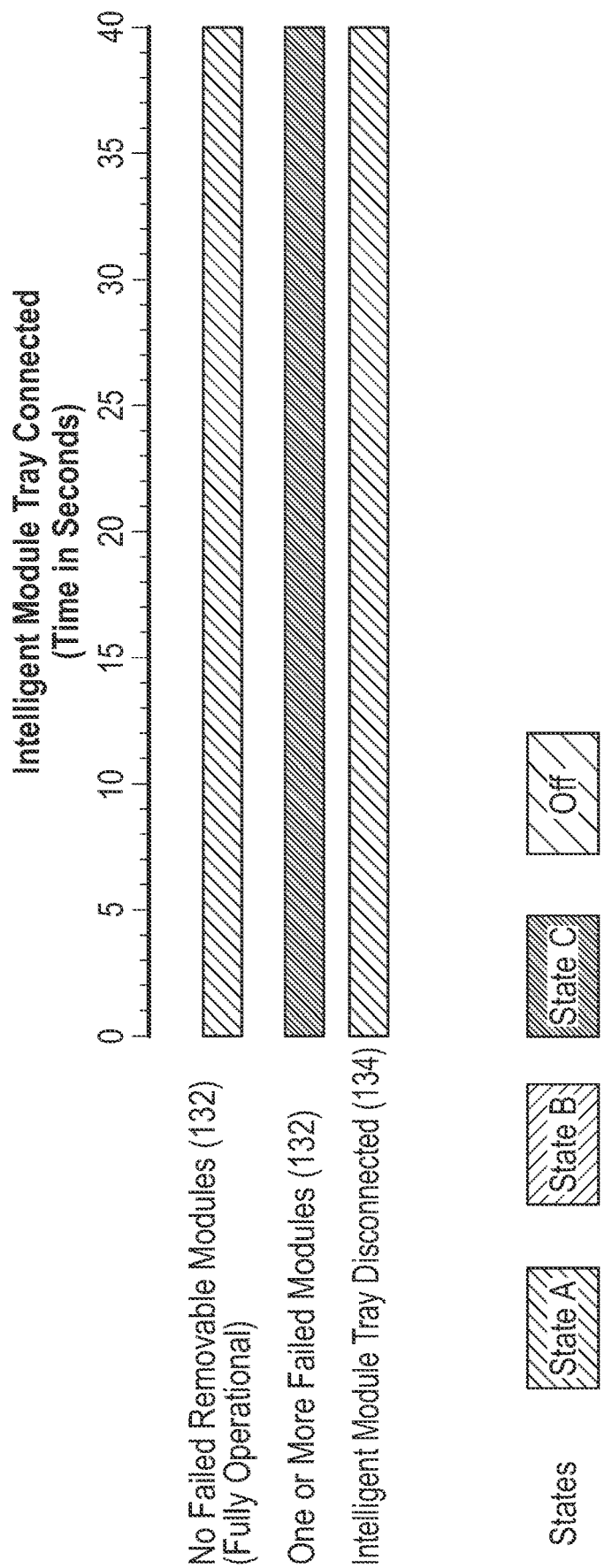
FIGS. 4A and 4B illustrate how visual display indicators of the overall intelligent module tray change when the intelligent module tray is disconnected from motherboard, according to embodiments of the present disclosure.
Figure 4B:
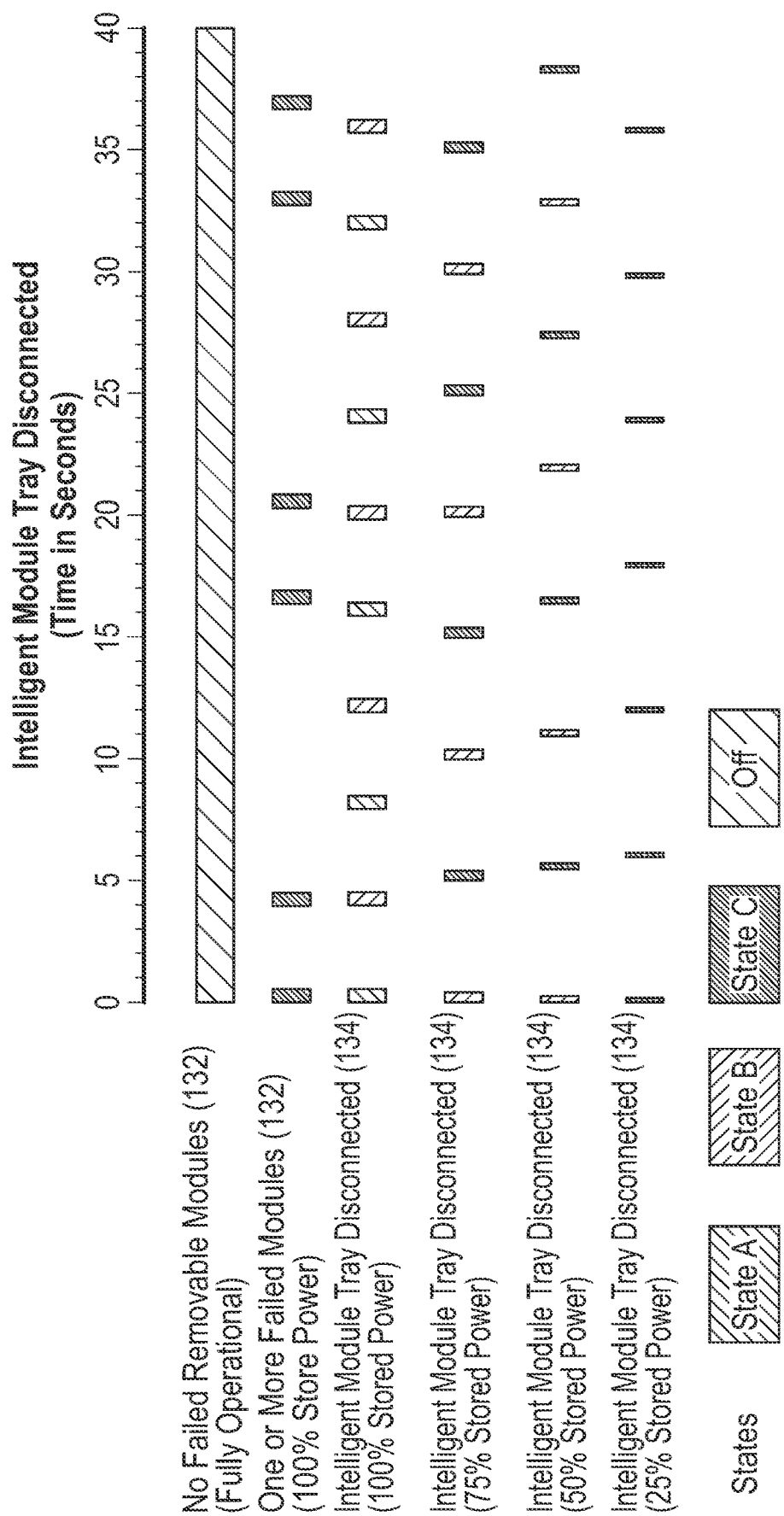

FIGS. 4A and 4B illustrate how the visual display indicators of the overall intelligent module tray operate when intelligent module tray 110 is connected to or disconnected from motherboard 140 and power supplies 142, according to embodiments of the present disclosure. Visual indicator 132 may indicate whether there are any problems in any of removable modules 112, without necessarily identifying which removable module 112 has a problem. Visual indicator 134 may indicate whether tray 110 is connected to motherboard 140.

As discussed above with respect to FIGS. 3A and 3B, removable modules 112 that are fully operational may result in their visual display indicators 132, 134 being powered off when tray 110 is disconnected from motherboard 140. Second, unlike when intelligent module tray 110 is connected and all visual display indicator sequences are concurrent, the visual display indicator sequences are exercised in a sequential manner when tray 110 is disconnected from motherboard 140. In the disconnected scenario shown in FIG. 4B, only the 100% power configuration is shown. The active displays would change according to different power levels as shown in FIGS. 11 and 12.

FIG. 4A may illustrate how visual indicators 132, 134 operate while tray 110 while tray 110 is connected to motherboard 140 and power supplies 142, while FIG. 4B may illustrate how visual indicators 132, 134 operate while tray 110 is disconnected from motherboard 140 and power supplies 142.

In the example shown in FIG. 4A, visual indicator 132 has been used to show two different instances of removable module statuses—a fully operational state A indicating no failed removable modules 112, and a state C indicating one or more failed removable modules 112—when tray 110 is connected to motherboard 140 and power supplies 142. Visual indicator 132 may change mode (e.g., from green to red) when one or more modules 112 have failed. Moreover, when tray 110 is connected to motherboard 140 and power supplies 142, display indicator 134 may be green in state A.

In the disconnected scenario of FIG. 4B, visual indicator 132 may either be off (state A, all removable modules are fully operational) or turn to a blinking display (state C, one or more removable modules have failed). In FIG. 4B, visual indicator 134 might not be in state A, as tray 110 is disconnected from motherboard 140 and power supplies 142. Moreover, display indicator 134 may change as the available stored power diminishes. While the same states may blink in various cases, such as 75%, 50%, 25%, the intensity of indicator 134 may be fainter in each successive case (although reduced intensity or being fainter is not shown in the thatching or shading of FIG. 4). In this example, visual indicator device 134 may thus also be used to display the stored power status. The reduction of stored power may have four effects on the display (see FIG. 11). Modes of the display may be varied to reflect the available power status. Power-on time of the display may thus be reduced. Power-off time of the display may be increased; and the power supplied to the display may be reduced (making it fainter). By employing these measures, the power consumption of visual displays 130, 132 and 134 may be reduced. However, this may come at the cost of decreased discernibility to users of system 100. Therefore, there may be a trade-off between the ability to interpret the condition indicated by the display and the power consumption of the visual indicator display. This trade-off may be linked directly with the module with which the display is associated. Alternatively, the trade-off may be determined by the total number of modules that are in tray 110 that require the displays to be active. Essentially, this may utilize a dynamic trade-off algorithm rather than a predefined setting.

Returning to FIG. 1, illustrated is a baseboard management controller (BMC) 150, which may be responsible for several functions. BMC 150 may detect all intelligent module trays 110 installed in system 100. This can include the addition and removal of trays while system 100 is operational. BMC 150 may detect all removable modules 112 in each intelligent module tray 110. This can include the scenario where an intelligent module tray has been removed, reconfigured, then reinstalled. BMC 150 may ensure display data is available for all possible intelligent module tray and removable module conditions. BMC 150 may ensure data is available for all visual display indicators 130, 132 and 134 in all removable modules 112 and intelligent module tray 110. BMC 150 may obtain any missing data from an external maintenance server. In the case where a timing or display indicator power setting is based on a formula, BMC 150 may compute discrete values for the display element. Moreover, any such display management operations may be performed by controller 120.

Figure 5:
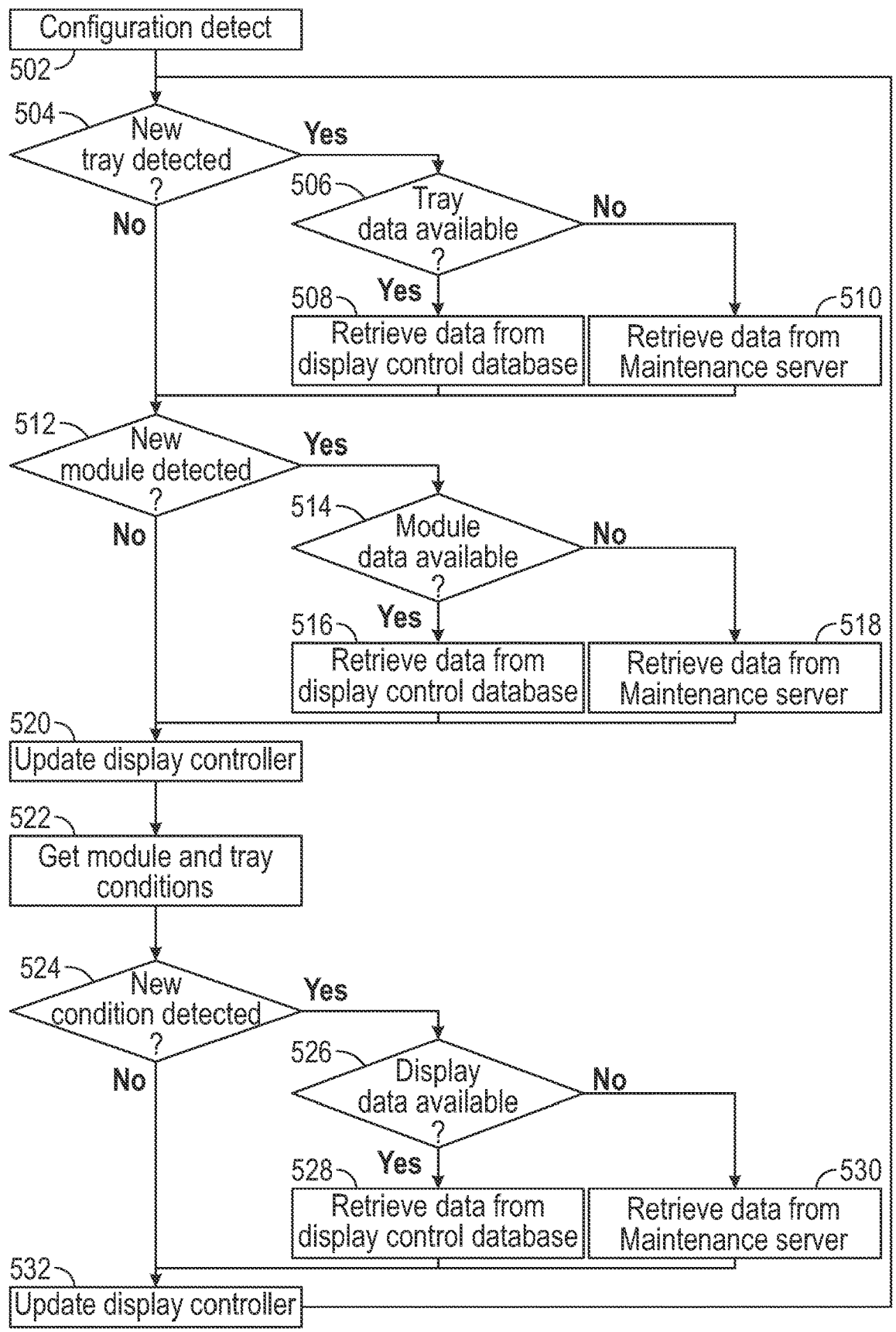
FIG. 5 shows an example of a flowchart for a baseboard management controller function, according to embodiments of the present disclosure.

FIG. 5 shows an example of a flowchart for operation of BMC 150, according to embodiments of the present disclosure. At step 502, BMC 150 may perform a check of the current configuration to determine such a configuration. The current configuration may be compared to the previous configuration. This may include referencing the hardware details of all discovered intelligent module trays 110 and the removable modules 112 that they contain. The steps of FIGS. 5 and 6 may be performed in any suitable order, performed in parallel or recursively, or optionally omitted or repeated as needed.

At step 504, BMC 150 may determine if a new intelligent module tray has been detected. If one or more new trays have been detected, then step 506 may be executed next. Otherwise, step 512 may be executed.

At step 506, BMC 150 may determine if the associated data for any newly discovered module trays is in a display controller database 156. If the data is not available, then step 510 may be executed. Otherwise, step 508 may be executed.

At step 508, the display sequence data and display technology type may be retrieved from display controller database 156. Then, step 512 may be executed.

At step 510, BMC 150, using network communications interface 158, may contact maintenance server 170 via a wide area network 160 or other suitable network. BMC 150 may retrieve display sequence data for any new intelligent module trays that are not already included in display controller database 156. Once retrieved, BMC 150 may store the new data in display controller database 156.

At step 512, BMC 150, using data from step 502, may determine if a new replaceable module has been detected. This can include a module from a newly added intelligent module tray or a module that has been recently replaced in server 100. If a new replaceable module is discovered, then step 514 may be executed next. Otherwise, step 520 may be executed.

At step 514, BMC 150 may determine if the associated data for any newly discovered removable modules are in display controller database 156. If the data is not available, then step 518 may be executed. Otherwise, step 516 may be executed.

At step 516, the display sequence data may be retrieved from display controller database 156. Then, step 520 may be executed.

At step 518, BMC 150, using network communications interface 158, may contact maintenance server 170 via the wide area network 160. BMC 150 may retrieve display sequence data for any new removable modules that are not already included in display controller database 156. Once retrieved, BMC 150 may store the new data in display controller database 156.

At step 520, BMC 150 may construct the new display sequence data for the new hardware that has been discovered. BMC 150 may then send this new data to display controller 120. This may ensure that the correct display sequences are available for any newly discovered hardware.

At step 522, module and tray conditions may be retrieved.

At step 524, BMC 150 may determine if there are any new conditions for the existing intelligent module trays 110 or removable modules 112 therein. These conditions can be determined by BMC 150 or from motherboard 140.

At step 526, BMC 150 may determine if a new condition has been added since the last check. If one or more new conditions have been discovered, then step 528 may be executed. Otherwise, step 530 may be executed.

At step 528, the display sequence data for any new conditions may be retrieved from display controller database 156. Then, step 532 is executed.

At step 530, BMC 150, using network communications interface 158, may contact maintenance server 170 via wide area network 160. BMC 150 may retrieve display sequence data for any new conditions that are not already included in display controller database 156. Once retrieved, BMC 150 may store the new data in display controller database 156.

At step 532, BMC 150 may update display controller 120 with any new conditions that have been discovered. Display controller 120 may select the appropriate display sequence for both intelligent module tray 110 connected and disconnected to motherboard 140. The sequence for the respective displays may be adjusted using the new data. Step 504 may be executed next. This may restart the loop and BMC 150 may continue to look for new hardware and new conditions to ensure that display controller 120 has the required display sequences. If tray 110 is disconnected, display controller 120 may operate with the most recently received operating parameters from BMC 150.

Returning to FIG. 1, display controller 120 may work in concert with BMC 150. As shown above in FIG. 5, BMC 150 provides programming information to display controller 120 to ensure the correct display sequencing. The data may be for both scenarios, wherein intelligent module tray 110 is connected or disconnected to motherboard 140 and power supplies 142. This allows display controller 120 to program the correct display sequences even when display controller 120 is disconnected from BMC 150. Further, display controller 120 may alter the display sequence depending on the amount of power that is available from low power storage device 124.

Figure 6:
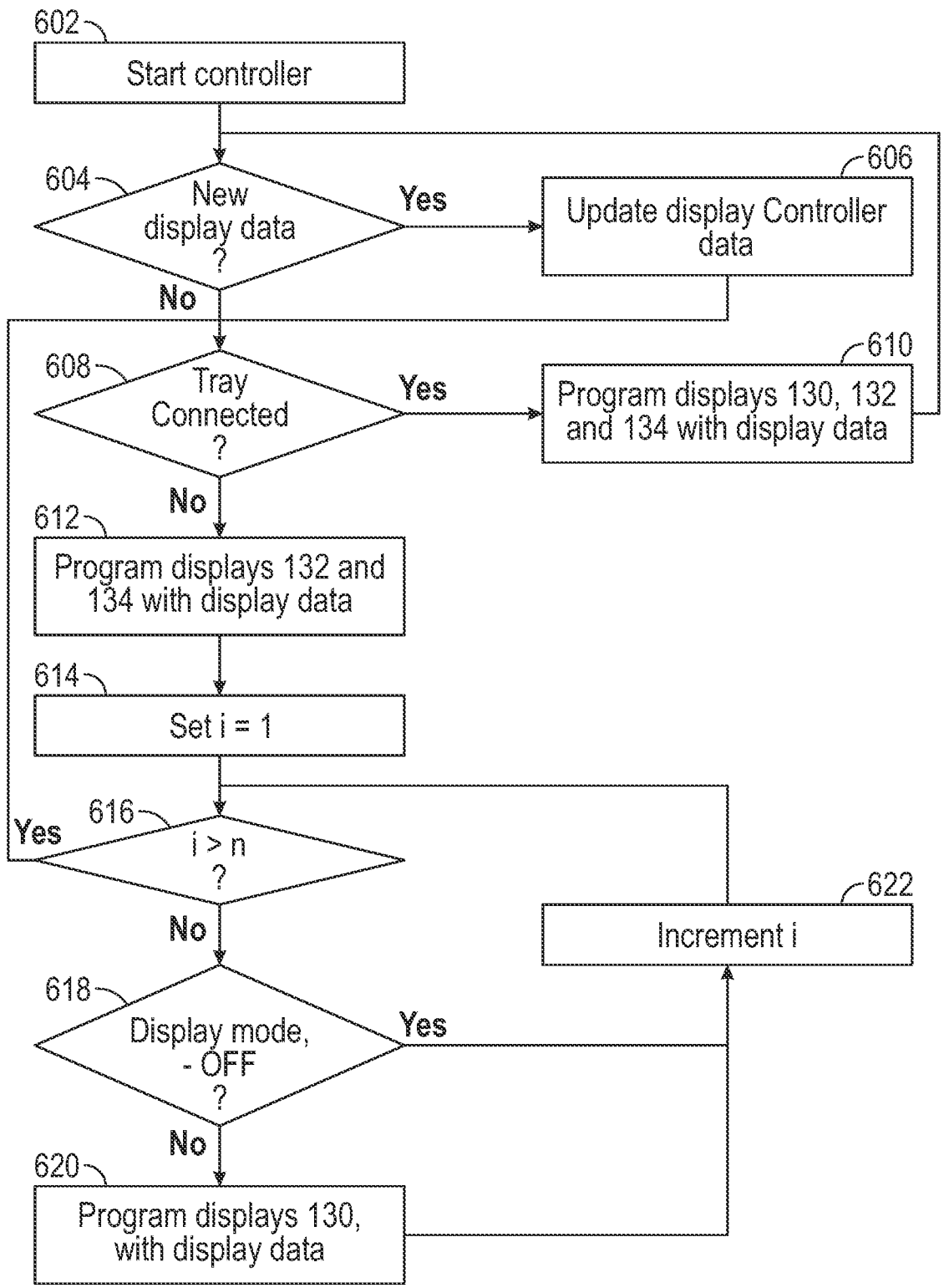
FIG. 6 illustrates a flow chart that shows how a display controller may alter a display sequence depending on the amount of power that is available from a low power storage device, according to embodiments of the present disclosure.

FIG. 6 illustrates a flow chart that shows how display controller 120 may alter the display sequence depending on the amount of power that is available from low power storage device 124, according to embodiments of the present disclosure.

At step 602, display controller 120 operation may be initialized.

At step 604, display controller 120 may determine if new display sequence data has been provided by BMC 150. If it has, then step 606 may be executed next. Otherwise, step 608 may be executed.

At step 606, display controller 120 may update the display controller data both for connected and disconnected scenarios. This may also include information regarding how the displays will adjust to various power conditions.

At step 608, display controller 120 may determine whether its associated intelligent module tray 110 is connected to motherboard 140 and power supplies 142. If it is, step 610 may be executed next. Otherwise, step 612 may be executed next.

At step 610, display controller 120 may program displays 130, 132 and 134 in such a fashion that their display sequences are executed using the connected scenario information in the display controller data. This may allow for the best visibility, but consume the most power. Since intelligent module tray 110 is connected to motherboard 140 and power supplies, power consumption might not be not an issue. Alternatively, certain indicators may not be visible when tray 110 is connected and these indicators may be turned OFF as they are not required at that point. Step 604 may be executed next to check for any new display data.

At step 612, display controller 120 may program displays 132 and 134. This may allow visual display indicator 134 to reflect the available power level. The on/off timing and power mode (the amount of power supplied to the indicator as a percentage of the maximum power supplied power level) may be adjusted to match the available power from low power storage device 124.

At step 614, a loop count i may be set to an initial value, such as 1, to initialize a loop containing steps 616 through 622.

At step 616, loop counter i may be compared to n, where n is the number of removable modules in the intelligent module tray 110. If i is greater than n, step 608 may be executed next. Otherwise, step 618 may be executed. This may allow display controller 120 to program visual display indicators 130A-130N in a sequential fashion. This may make the displays less visible, but still viable, while using less power thus lengthening the amount of time that low power storage device 124 can illuminate the displays.

At step 618, display controller 120 may check to see if the mode for visual display indicator 130, is set to OFF. If it is, then the visual display indicator can be skipped, by executing step 622, as it is not operational. If it is not, then step 620 may be executed next.

At step 620, display controller 120 may program visual display indicator 130, with any new display sequence data. The new data may be due to a change in the amount of available power from low power storage device 124 or a connection or disconnection to BMC 150. The display may be allowed to complete its display sequence before moving to step 622.

At step 622, loop counter i may be incremented and step 616 executed next. This may continue the execution of the loop containing steps 616-622.

Returning to FIG. 1, when intelligent module tray 110 is physically disconnected from motherboard 140, power supplies 142 might no longer supply power to display controller 120 and associated visual display indicators 130, 132, 134. Once this occurs, local power in tray 110 may be sourced from low power storage device 124. Low power storage device 124 may be implemented as an electrostatic storage device, but may also be an electrochemical storage device. For example, device 124 may be implemented as a capacitor or a rechargeable battery. Intelligent module tray 110 may include or be connected to a charging circuit 126 configured to provide power to low power storage device 124 while intelligent module tray 110 is connected to motherboard 140 and power supplies 142. Power converter 128 can supply power to display controller 120 and associated visual display indicators 130, 132, 134 when intelligent module tray 110 is disconnected. When connected to motherboard 140, power may be supplied from power supplies 142 to power isolation switch 136. Power isolation switch 136 may route power to removable modules 112, display controller 120 and charging circuit 126. No power might be routed to power converter 128. The power routed to charging circuit 126 is used to store power, or charge, low power storage device 124. Further, when power is supplied to display controller 120 from power isolation switch 136, no power might be supplied from power converter 128 to display controller 120.

Upon disconnection of intelligent module tray 110 from motherboard 140 (which contains power supplies 142), removable modules 112 may have residual energy stored within them. This could be from, for example, electrostatic devices such as capacitors, electromagnetic devices such as inductors and transformers, or other energy storage devices therein (not shown). When, upon disconnection, power from power supplies 142 is removed from tray 110, power isolation switch 136 may route any residual power from removable modules 112 to power converter 128. This inherent energy can be used to power display controller 120 and associated visual display indicators 130, 132, 134. This may allow the visual display indicators to function for a period of time without using any energy stored in low power storage device 124. This may effectively extend the amount of time the visual display indicators can function after the power is removed from motherboard 140 and power supplies 142 due to, for example, disconnection of tray 110 from motherboard 140. Once all of the usable power has been consumed from the removable modules 112, power isolation switch 136 may disconnect from power converter 128 and remove connectivity from power converter 128 to or from removable modules 112.

During normal operation when intelligent module tray 110 is connected to motherboard 140, BMC 150 can communicate to each removable module 112 using serial communication interfaces 154 and 116. Using this communications channel, processing unit 152 can determine the operational status of each removable module 112. Processing unit 152 may be implemented by a processor, control logic, microcontroller, or any other suitable analog circuitry, digital circuitry, instructions for execution by a processor, or any suitable combination thereof. In the case of an operational deficiency, such as network interface failure, hard drive upgrade, broken USB connector, the operational deficiency can be analyzed by processing unit 152 and the cause determined. If the deficiency is caused by a removable module 110, the operationally deficient module 110 may need to be replaced. Further, processing unit 152 may isolate the specific intelligent module tray 110 that houses the removable module(s) 112 that are to be replaced. Visual display indicator 132 may be used to identify an intelligent module tray(s) 110 that houses a removable module(s) 112 that needs to be replaced based upon, for example, the analysis described above. A second visual display indicator 134 may be used to signal the internal status of intelligent module tray 110. For example, certain internal operations may be required to complete prior to removal of intelligent module tray 110.

Processing unit 152 may communicate with display controller 120 via serial communications interfaces 122, 154. As mentioned earlier, processing unit 152 may enumerate the instances of removable modules 112 in a given intelligent module tray 110. Using the collected intelligence, processing unit 152 may determine the required visual display indicator operating parameters that are required for the various module configurations that are present. This can include a set of requirements for visual display indicators 130, 132, 134 for both the condition when intelligent module tray 110 is connected to power supplies 142 and when they are not. The set of requirements when tray 110 is not connected to power supplies 142 may be used to determine the amount of power that is consumed by visual display indicators 130, 132, 134, plus associated elements display controller 120, low power storage device 124 and power converter 128.

Display controller 120 may include functionality that can selectively enable visual display indicators 130, 132, 134. Display controller 120 may be configured to selectively enable indicators 130, 132, 134 in a manner to extend the amount of time that low power storage device 124 can power the visual display indicators while tray 110 is disconnected from power supplies 142. This can be accomplished in two ways.

In one embodiment, only specific states of intelligent module tray 110 and associated removable modules 112 may be selectively displayed. For example, prior to disconnection of intelligent module tray 110 from motherboard 140, processing unit 152 can notify display controller 120 which specific removable modules 112 require replacement. Only visual display indicators 130, 132, 134 that are associated with removable modules 130 that require replacement might be enabled after disconnecting tray 110 from power supplies 142 and enabling use of low power storage device 124. Other visual display indicators 130, 132, 134 that are associated with modules 130 that do not require replacement might be disabled. This may be different from the display pattern used when intelligent module tray 110 is connected to motherboard 140 and power supplies 142, for example visual display indicators 130, 132, 134 may indicate various operating states.

Secondarily, when intelligent module tray 110 is disconnected from motherboard 140, display controller 120 may display individual visual display indicators 130, 132, 134 in a specific sequence. This may further limit power consumption and increase the time that low power storage device 124 can activate the visual display indicators 130, 132, 134. The cycling pattern, including the sequencing, time on and time off, may be previously set by processing unit 152. The information is programmed into display controller 120 prior to disconnection of intelligent module tray 110 from motherboard 140. The sequencing pattern may or may not be static. This allows a different sequencing pattern to be used over time. By decreasing the visual display on time and increasing the visual display off time, a longer overall display time can be achieved.

After displays 130, 132, 134 indicating a need for remediation have been acknowledged, for example, by a service technician, intelligent module tray 110 may be removed for remediation. Displays 130, 132, 134 may indicate that one or more removable modules 112 may need to be replaced. These modules may be replaced with an identical module or a different version of the module, e.g., an upgrade. Alternatively, intelligent module tray 110 may be removed to replace existing removable modules 112 with completely different modules to provide different functionality. Finally, intelligent module tray 110 may be removed to add additional removable modules 112 in any vacant slots. In any case, removable modules 112 that have been replaced might not have the same display requirements as the previous ones.

To address changes in removable module functionality, BMC 150 may include a display controller database 156. Database 156 may contain a library of possible instances of modules 112 and their associated display parameters. BMC 150 may be configured to query intelligent module tray 110, using serial communications controllers 154, 116, to determine the identity of the currently installed removable modules 112. Using the information collected, BMC 150 can use processing unit 152 to extract the associated display controller information. This can include which specific display indicators, 130, 132, 134 that are to be used and the illumination sequence. If BMC 150 cannot find a relevant record in display controller database 156, it can obtain the necessary information for the new removable module 112 it has discovered. BMC 150 can then construct display controller configuration data for the current configuration of intelligent module tray 110. This configuration information can be downloaded to display controller 120 using serial communications controllers 122, 154. In this manner, display controller 120 may have a dynamically constructed configuration that may optimize the use of low power storage device 124.

Using display controller 120, visual display indicators 130, 132, 134 can be controlled using display sequence data. (see FIG. 1). Display sequence data may be constructed using a series of display data sets. Display data sets are constructed using display data elements, or parameters. The display data elements may include, but are not limited to, display mode, display power level, display timing as shown in FIG. 7.

Display sequences associated with visual displays 132 and 134 may be dependent upon the configuration of intelligent module tray 110. Display sequences associated with visual displays 130 may be dependent upon intelligent module tray 110 and removable module 112 configurations.

Many different possible display sequences may exist for each visual display indicator. The display sequences may be aligned with different operating conditions. For example, different sets of display sequences may be needed for different power levels that are available. For example one set of sequences may be used for the case where intelligent module tray 110 is connected to motherboard 140, and multiple sets of other sequences may be used for the case where intelligent module tray 110 is disconnected from motherboard 140. Further, the display sequence set may depend on the operability for either intelligent module tray 110 or removable module 112. One set may represent full functionality, one set for upgrade candidates, and multiple sets for failure conditions.

The display mode may be dependent on the type of technology used for visual display indicators 130, 132 and 134. Visual display technologies can include, for example, a single color LED, multicolor LED, alphanumeric LED display, or alphanumeric LCD display. A single color LED would only have two modes—e.g., on and off. Multicolor LEDs can have modes such as color 1 on, color 2 on, color n on, and off. Alphanumeric LCD displays may have a large number of modes, each one representing a character they can display. A special mode, e.g., OFF, may denote a state where the visual display indicator is not consuming any power. When a removable module 112 is removed, its associated visual display indicator may be set to OFF. When all removable modules 112 that require attention are removed, i.e., all visual display indicators 130 are OFF, then visual display indicator 132 may be set to OFF.

Figure 8:
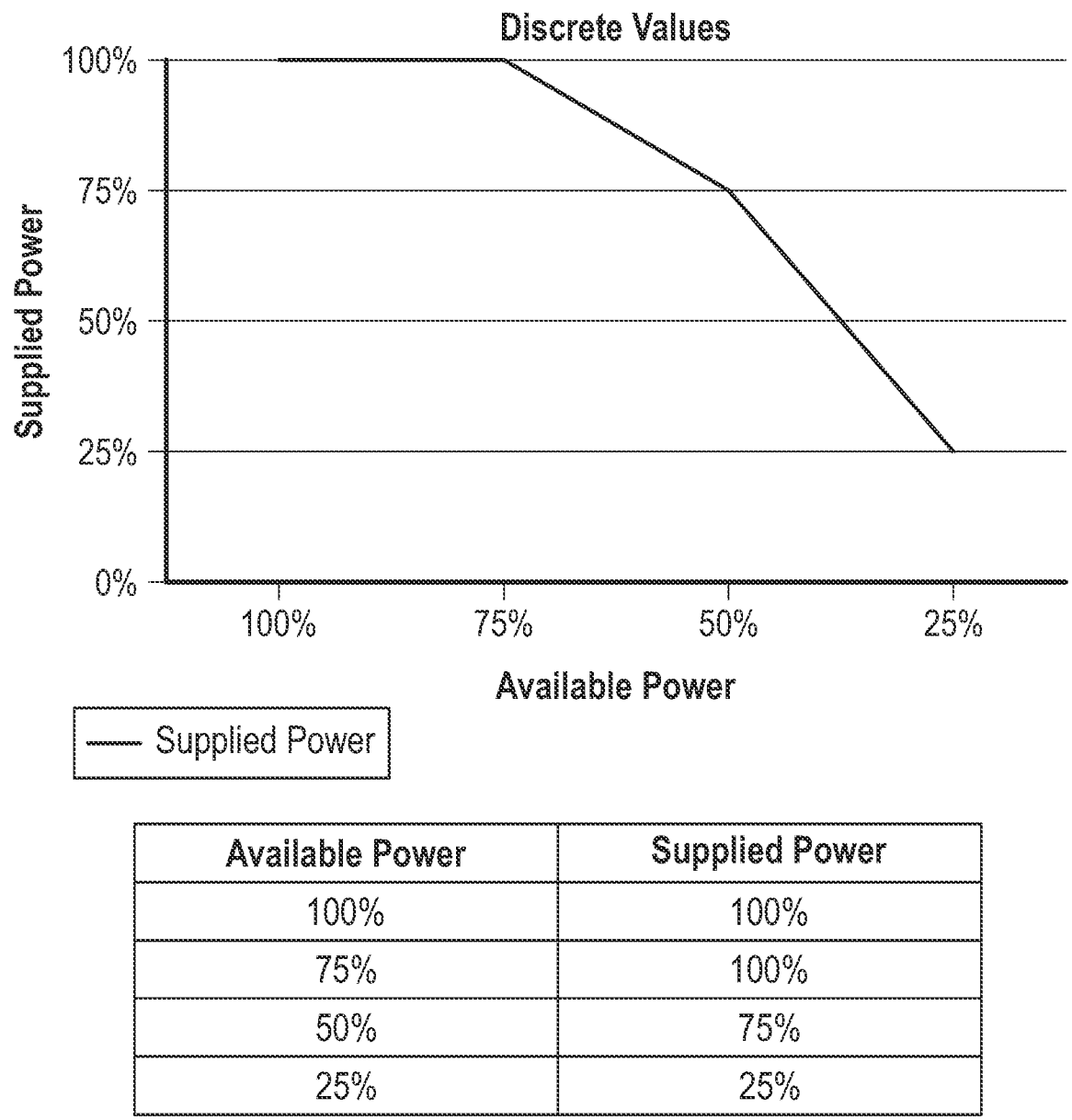
FIG. 8 shows discrete values of supplied power according to available power, according to embodiments of the present disclosure.
Figure 9:
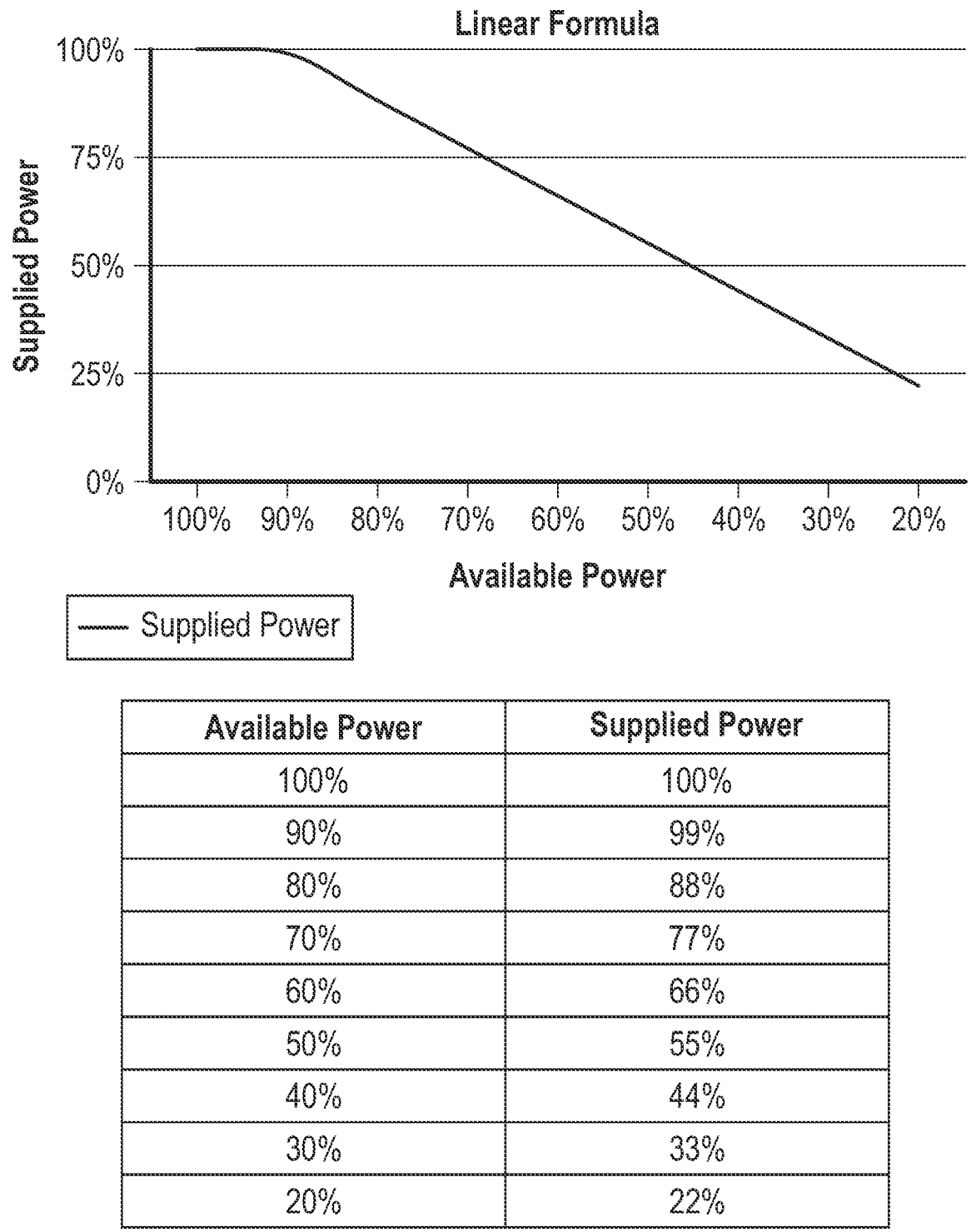
FIG. 9 shows formulaic (linear) values of supplied power according to available power, according to embodiments of the present disclosure.
Figure 10:
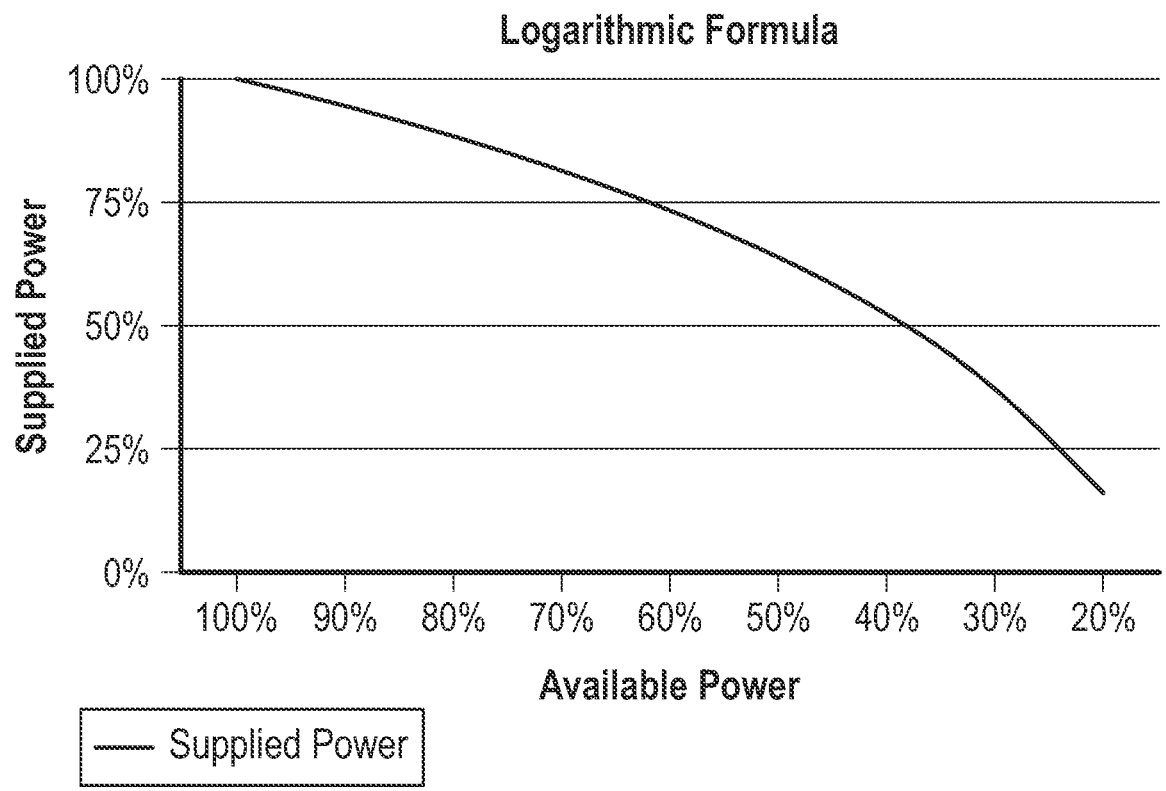
FIG. 10 shows formulaic (non-linear) values of supplied power according to available power, according to embodiments of the present disclosure.

The power level mode may determine the amount of power (whether defined in absolute or relative terms) that is supplied to visual display indicator 130. This may affect the brightness of visual display indicator 130. Typically, this would have little value when intelligent module tray 110 is connected to motherboard 140, with power consumption not being an issue. However, when intelligent module tray is disconnected from motherboard 140, power consumption may be more of a concern. The power level mode values can be set discretely or algorithmically. For power level modes that are to be set discretely, the values would be associated with specific power levels available from low power storage device 124. For power level modes that are to be algorithmically, the amount of power supplied to the visual display indicator may be derived formulaically. FIGS. 8-10 illustrate example power mode value calculation methods, denoted as supplied power.

FIG. 8 shows discrete values of supplied power according to available power, according to embodiments of the present disclosure. For example, if 100% or 75% of the possible power is available, then the indicators may be powered at a full amount, 100%. If 50% of the possible power is available, then the indicators may be powered at 75%. If 25% of the possible power is available, then the indicators may be powered at 25%.

FIG. 9 shows formulaic (linear) values of supplied power according to available power according to the following equation, according to embodiments of the present disclosure.

Supplied Power=$M$*(available power/max power) ($M$=1.05)

M may be any suitable factor, and may be chosen experimentally.

FIG. 10 shows formulaic (non-linear) values of supplied power according to available power according to the following equation, according to embodiments of the present disclosure.

Supplied Power=1+($M$*Log$_{10}$(available power/max power)) ($M$=1.3)

M may be any suitable factor, and may be chosen experimentally.

Returning to FIG. 7, the display timing mode may determine the amount of time a visual display indicator is in a specific display mode. Display timing can be applied separately and uniquely to active mode (when the visual display indicator is powered) and inactive mode (when the visual display indicator is not powered). The amount of time that a visual display indicator spends in a powered mode may be selectively enforced when intelligent module tray 110 is disconnected from motherboard 140. As the amount of stored power is reduced, then the timing values can be changed accordingly. Display indicator on-times can be reduced, while off times can be increased. The amount of increase and decrease may be dependent on the initial settings, wherein the amount of stored power equals 100%. A constant value given as DisplayOnMax may refer to the display on, or active, time period that is to be used when the system includes a full amount (100%) of stored power, and a constant value given as DisplayOffMax may refer to the display off, or inactive time, period that is to be used when the system includes a full amount (100%) of stored power. If not otherwise explicitly defined, then DisplayOnMax and DisplayOffMax can be, by default, equal to the values used when intelligent module tray 100 is connected to motherboard 140. Display timing mode values can be set discretely or algorithmically. In the case of discretely set display timing mode values, the values may be associated with specific power levels available from low power storage device 124. In the case of algorithmically set display timing mode values, the amount of power supplied to the visual display indicator may be derived formulaically. When intelligent module tray 110 is disconnected from motherboard 140, display timing values for active modes may be reduced and those for inactive OFF modes may be increased. If the display timing mode is set to 0, then the display may be constantly powered. Table 1 and Table 2 show example values for both active and inactive display modes. The timing values shown below may express time spent on (in the case of Table 1) or time spent off (in the case of Table 2) in seconds.

TABLE 1

Active mode display timing vs Available Power

| Discrete | | Linear Formula | | Non-linear (Logarithmic) Formula | |
|---|---|---|---|---|---|
| Available Power | Display Timing (seconds) | Available Power | Display Timing (seconds) | Available Power | Display Timing (seconds) |
| 100% | 0.50 | 100% | 0.50 | 100% | 0.50 |
| 75% | 0.50 | 90% | 0.50 | 90% | 0.47 |
| 50% | 0.40 | 80% | 0.44 | 80% | 0.44 |
| 25% | 0.30 | 70% | 0.39 | 70% | 0.40 |
|  |  | 60% | 0.33 | 60% | 0.36 |
|  |  | 50% | 0.28 | 50% | 0.30 |
|  |  | 40% | 0.22 | 40% | 0.24 |
|  |  | 30% | 0.17 | 30% | 0.16 |
|  |  | 20% | 0.11 | 20% | 0.05 |

Linear Formula:

Display timing=$M$*DisplayOnMax*(available power/max power) ($M$=1.1)

M may be any suitable factor, and may be chosen experimentally.

Non-Linear Formula

Display timing=DisplayOnMax*(1+($M$*log$_{10}$(available power/max power))) ($M$=1.3)

M may be any suitable factor, and may be chosen experimentally.

TABLE 2

Inactive mode display timing vs Available Power

| Discrete | | Linear Formula | | Non-linear (Logarithmic) Formula | |
|---|---|---|---|---|---|
| Available Power | Display Timing (seconds) | Available Power | Display Timing (seconds) | Available Power | Display Timing (seconds) |
| 100% | 2.00 | 100% | 2.00 | 100% | 2.00 |
| 75% | 2.25 | 90% | 2.11 | 90% | 2.12 |
| 50% | 3.00 | 80% | 2.25 | 80% | 2.25 |
| 25% | 4.00 | 70% | 2.43 | 70% | 2.40 |
|  |  | 60% | 2.67 | 60% | 2.58 |
|  |  | 50% | 3.00 | 50% | 2.78 |
|  |  | 40% | 3.50 | 40% | 3.03 |
|  |  | 30% | 4.33 | 30% | 3.36 |
|  |  | 20% | 6.00 | 20% | 3.82 |

Linear Formula:

Display timing=$M$*DisplayOffMax*(1+(max power/available power)) ($M$=0.5)

M may be any suitable factor, and may be chosen experimentally.

Non-Linear Formula

Display timing=DisplayOffMax*(1+($M$*log$_{10}$(max power/available power))) ($M$=1.3)

M may be any suitable factor, and may be chosen experimentally.

FIG. 11 illustrates an example of sequencing for two different kinds of removable modules, according to embodiments of the present disclosure. An intelligent module tray may contain multiple removable modules of the same type.

Shown in FIG. 11 are example sequencing for a removable storage device, such as removable modules 112A, 112B, and example sequencing or a multiport network interface device, such as removable modules 112C, 112D.

For both the removable storage device and the multiport network interface device, when the module is fully operational and the tray is connected to the motherboard, the associated visual display indicator 130 may be in state A, and constantly on. The constantly on operation may be denoted by "0" for display timing mode. For both the removable storage device and the multiport network interface device, when the module is fully operational and the tray is disconnected from the motherboard, the associated visual display indicator 130 may be off constantly. For these cases, the power mode, or brightness or intensity of display, may be 100% of possible output.

For the removable storage device and an error, such as the device is not responding, and the tray is connected to the motherboard, the associated visual display indicator 130 may be in state A for 1 second, off for 1 second, and repeat. If the tray is not connected to the motherboard and has 100% of reserve power available, the associated visual display indicator 130 may be in state A for 500 milliseconds, off for 4 seconds, and repeat. The power mode, or brightness or intensity of display, may be 100% of possible output. If the tray is not connected to the motherboard and has 75% of reserve power available, the associated visual display indicator 130 may be in state A for 400 milliseconds at 90% power level mode of display, off for 4.5 seconds, and repeat. If the tray is not connected to the motherboard and has 50% of reserve power available, the associated visual display indicator 130 may be in state A for 300 milliseconds at 70% power level mode of display, off for 5 seconds, and repeat. If the tray is not connected to the motherboard and has 25% of reserve power available, the associated visual display indicator 130 may be in state A for 200 milliseconds at 100% power level mode of display, off for 5.5 seconds, and repeat. In this last case the power level may be set to 100% to ensure visibility for the short time in state A.

For the removable storage device and an error and the tray is not connected to the motherboard, such as wherein the device has an internal failure detected, the timing and power parameters may be the same as the example for the device not responding as described above, except that the associated visual display indicator 130 may be utilized in state C instead of state A.

For the removable storage device and an error and the tray is not connected to the motherboard, such as the device requires an upgrade, the timing and power parameters may be the same as the example for the device not responding as described above, except that the associated visual display indicator 130 may be utilized in state B instead of state A.

For the multiport network interface device and an error, such as a single port failure, and the tray is connected to the motherboard, the associated visual display indicator 130 may be in state A for 1 second, off for 1 second, in state A for 1 second, off for 1 second, and repeat. If the tray is not connected to the motherboard, the associated visual display indicator 130 may be in state A, off, state A, off, and repeat. The duration of state A and off may be according to the linear scales of Tables 1 and 2, above, using M=0.48, which may depend in turn upon the specific power available on the tray. The power level of the display of visual display indicator 130 may be provided according to the logarithmic scale of FIG. 10, above, using M=1.0, which may depend in turn upon the specific power available on the tray. For example, at 70% power, the associated visual display indicator 130 may be in state A, off, state A, off, and repeat, wherein state A is on for a time given by:

On Display Time=$M$*DisplayOnMax*(available power/max power)

On Display Time=0.48*1.0*(0.7)

On Display Time=0.336 seconds and off for a time given by:

Off Display Time=$M$*DisplayOffMax*(1+(max power/available power))

Off Display Time=0.48*1.0*(1+1/0.7)

Off Display Time=1.165 seconds at a power level given by:

Power Level=1+($M$*Log$_{10}$(available power/max power))

Power Level=1+(1.0*Log$_{10}$(0.7))

Power Level=1+(−0.1549)=0.845 or 84.5%.

Since DisplayOnMax and DisplayOffMax times are not defined for the case where intelligent module tray 110 is disconnected, the values for the connected case are used (as described earlier).

FIG. 12 shows an example of the sequencing of indicators for an intelligent module tray, according to embodiments of the present disclosure. Example values for indicators 132, 134 of a given tray 110 are illustrated. System 100 may contain more than one instance of intelligent module tray 100.

When there are no failed removable modules, and when tray 110 is connected to motherboard 140, indicator 132 may be in state A, and constantly on. When there are no failed removable modules, and when tray 110 is disconnected from motherboard 140, indicator 132 may be off constantly. For these cases, the power mode, or brightness or intensity of display, may be 100% of possible output.

When there are one or more failed removable modules, and when tray 110 is connected to motherboard 140, indicator 132 may be in state A for 1 second at 100% power level, then off for 1 second, and then repeat. When there are one or more failed removable modules, and when tray 110 is disconnected from motherboard 140, and tray 110 has 100% of reserve power available, indicator 132 may be in state A for 500 milliseconds at 100% power level, then off for 4 seconds, and then repeat. When there are one or more failed removable modules, and when tray 110 is disconnected from motherboard 140, and tray 110 has 75% of reserve power available, indicator 132 may be in state A for 400 milliseconds at 90% power level, then off for 4.5 seconds, and then repeat. When there are one or more failed removable modules, and when tray 110 is disconnected from motherboard 140, and tray 110 has 50% of reserve power available, indicator 132 may be in state A for 300 milliseconds at 70% power level, then off for 5 seconds, and then repeat. When there are one or more failed removable modules, and when tray 110 is disconnected from motherboard 140, and tray 110 has 25% of reserve power available, indicator 132 may be in state A for 200 milliseconds at 100% power level, then off for 5.5 seconds, and then repeat. In this last case the power level may be set to 100% to ensure visibility for the short time in state A.

When there are one or more modules to be upgraded, indicator 132 may operate as discussed above for state A, but instead for state B.

If there are both modules to be upgraded and modules that have failed, indicator 132 may operate as discussed above with interleaved and repeated state C and its associated off period as discussed above, and state B and its associated off period as discussed above. In other embodiments, states A and B may be interleaved.

Embodiments of the present disclosure may include a tray for modules that is configurable to be in power communication with a motherboard. The tray may include a tray status indicator to be powered by a power storage circuit within the tray when the tray is disconnected from the motherboard. The tray may include slots that are each configured to receive a removable module. Each removable module may be configurable to be in power communication with the tray. The tray may include module status indicators that are configured to be powered by the power storage circuit when the tray is disconnected from the motherboard. The tray may include a register to store an indication from a BMC that a given one of the removable modules has a fault, the indication to be persistent after disconnection of the tray from the motherboard. The tray may include a display controller circuit configured to selectively apply display schemes for the tray status indicator and the module status indicators depending upon whether the tray is connected to power of the motherboard.

In combination with any of the above embodiments, the tray may include a charging circuit configured to charge the power storage circuit from the motherboard when the tray is connected to the motherboard, and charge the power storage circuit from one or more of the removable modules when the tray is disconnected from the motherboard.

In combination with any of the above embodiments, the at least one removable module may be a device selected from storage device, network interface device, or video processing device.

In combination with any of the above embodiments, the tray status indicator may be is configured to indicate a state of the tray selected from: operating status of the at least one removable module, failure status of the at least one removable module, power communication status between the motherboard and the tray.

In combination with any of the above embodiments, the at least one module status indicator may be configured to indicate a state of at least one removable module selected from: operating status, upgrade status, and failure status.

In combination with any of the above embodiments, the display scheme applied by the display controller circuit when the tray is disconnected may be configured to use less power compared to the display scheme applied by the display controller circuit when the tray is connected.

In combination with any of the above embodiments, the display scheme applied by the display controller circuit when the tray is disconnected may have longer periods of OFF compared to the display scheme applied by the display controller circuit when the tray is connected.

In combination with any of the above embodiments, the display scheme applied by the display controller circuit when the tray is disconnected may have a burst time that is less compared to the display scheme applied by the display controller circuit when the tray is connected, wherein the burst time defines how long an indicator will be turned on once the indicator is turned on.

In combination with any of the above embodiments, the display scheme applied by the display controller circuit when the tray is disconnected may have a cycle time that is greater compared to the display scheme applied by the display controller circuit when the tray is connected, wherein the cycle time defines a periodic basis for which an indicator will be turned on and off.

In combination with any of the above embodiments, for a first state of the tray or modules, when the tray is connected to the motherboard, the display controller circuit may be configured to apply a first display scheme, the first display scheme including activation of an indicator for a non-zero length of time. For a second state of the tray or modules, when the tray is connected to the motherboard, the display controller circuit may be configured to apply a second display scheme, the second display scheme including activation of the indicator for a non-zero length of time. The first and second state may be mutually exclusive. For the first state of the tray or modules, when the tray is disconnected from the motherboard, the display controller circuit may be configured to apply a third display scheme, the third display scheme including constant deactivation of the indicator. For the second state of the tray or modules, when the tray is disconnected from the motherboard, the display controller circuit may be configured to apply a fourth display scheme, the fourth display scheme including activation of the indicator for a non-zero length of time.

In combination with any of the above embodiments, wherein the display scheme applied by the display controller circuit when the tray is disconnected may be fainter compared to the display scheme applied by the display controller circuit when the tray is connected.

In combination with any of the above embodiments, wherein the display scheme applied by the display controller circuit when the tray is disconnected may be configured to vary the brightness of an indicator according to a remaining power of the power storage circuit.

In combination with any of the above embodiments, wherein the display scheme applied by the display controller circuit when the tray is disconnected may be configured to vary periods of OFF for an indicator according to a remaining power of the power storage circuit.

In combination with any of the above embodiments, wherein the display scheme applied by the display controller circuit when the tray is disconnected may be configured to vary a burst time of an indicator according to a remaining power of the power storage circuit, wherein the burst time defines how long an indicator will be turned on once the indicator is turned on.

In combination with any of the above embodiments, wherein the display scheme applied by the display controller circuit when the tray is disconnected may be configured to vary a cycle time of an indicator according to a remaining power of the power storage circuit, wherein the cycle time defines a periodic basis for which an indicator will be turned on and off.

In combination with any of the above embodiments, wherein the display scheme applied by the display controller circuit when the tray is disconnected may be configured to cause an indicator to display a different color compared to when the tray is connected.

In combination with any of the above embodiments, wherein the display scheme applied by the display controller circuit when the tray is disconnected may be based upon a discrete supplied power value corresponding to available power.

In combination with any of the above embodiments, wherein the display scheme applied by the display controller circuit when the tray is disconnected may be based upon a linear formula from available power.

In combination with any of the above embodiments, wherein the display scheme applied by the display controller circuit when the tray is disconnected may be based upon a logarithmic formula from available power.

Embodiments of the present disclosure may include a BMC system. The BMC system may include a tray slot configured to receive a tray. The tray may include modules or may be configured to accept modules. The BMC system may include a control circuit configured to detect whether the tray has been inserted into the tray slot, detect any modules included in the tray, retrieve tray identity data from a display control database based upon the tray and the modules, detect insertion of a new module into the tray, retrieve module identity data from the display control database for the new module and upon detection of the new module, update a display controller circuit of the tray with retrieved tray identity data or retrieved module identity data, obtain tray status conditions and module status conditions, update the tray with determinations of tray status conditions and module status conditions, and provide the display controller circuit with display schemes for indicating the tray status conditions and module status conditions upon disconnection of the tray from the BMC system. The control circuit may cause output a tray status signal to a tray status indicator or output a module status signal to a module status indicator depending upon which status data has been retrieved.

In combination with any of the above embodiments, the BMC system may include a tray of any of the above embodiments.

In combination with any of the above embodiments, the tray status signal may indicate a state of the tray selected from: operating status of the at least one removable module, failure status of the at least one removable module, power communication status between the motherboard and the tray.

In combination with any of the above embodiments, the at least one module status signal may indicate a state of at least one removable module selected from: operating status, upgrade status, and failure status.

Embodiments of the present disclosure may include methods performed by any of the above embodiments, including trays, BMC systems, or portions thereof.

Embodiments of the present disclosure may include an article of manufacture including a non-transitory machine-readable medium including instructions, the instructions, when loaded and executed by a processor, cause the processor to perform any of the functionality of any of the above embodiments, including trays, BMC systems, or portions thereof.

Although example embodiments have been described above, other variations and embodiments may be made from this disclosure without departing from the spirit and scope of these embodiments.

We claim:

1. A tray for modules that is configurable to be in power communication with a motherboard, the tray comprising:
   a tray status indicator to be powered by a power storage circuit within the tray when the tray is disconnected from the motherboard;
   a plurality of slots, each slot configured to receive a removable module, each removable module configurable to be in power communication with the tray;
   a plurality of module status indicators, each module status indicator configured to be powered by the power storage circuit when the tray is disconnected from the motherboard;
   a register to store an indication from a baseboard management controller (BMC) that a given one of the removable modules has a fault, the indication to be persistent after disconnection of the tray from the motherboard; and
   a display controller circuit configured to selectively apply display schemes for the tray status indicator and the module status indicators depending upon whether the tray is connected to power of the motherboard.

2. The tray for modules of claim 1, further comprising a charging circuit configured to:
   charge the power storage circuit from the motherboard when the tray is connected to the motherboard; and
   charge the power storage circuit from one or more of the removable modules when the tray is disconnected from the motherboard.

3. The tray for modules of claim 1, wherein the at least one removable module is a device selected from storage device, network interface device, or video processing device.

4. The tray for modules of claim 1, wherein the tray status indicator is configured to indicate a state of the tray selected from: operating status of the at least one removable module, failure status of the at least one removable module, power communication status between the motherboard and the tray.

5. The tray for modules of claim 1, wherein the at least one module status indicator is configured to indicate a state of at least one removable module selected from: operating status, upgrade status, and failure status.

6. The tray for modules of claim 1, wherein the display scheme applied by the display controller circuit when the tray is disconnected is configured to use less power compared to the display scheme applied by the display controller circuit when the tray is connected.

7. The tray for modules of claim 1, wherein the display scheme applied by the display controller circuit when the tray is disconnected has longer periods of OFF compared to the display scheme applied by the display controller circuit when the tray is connected.

8. The tray for modules of claim 1, wherein the display scheme applied by the display controller circuit when the tray is disconnected has a burst time that is less compared to the display scheme applied by the display controller circuit when the tray is connected, wherein the burst time defines how long an indicator will be turned on once the indicator is turned on.

9. The tray for modules of claim 1, wherein the display scheme applied by the display controller circuit when the tray is disconnected has a cycle time that is greater compared to the display scheme applied by the display controller circuit when the tray is connected, wherein the cycle time defines a periodic basis for which an indicator will be turned on and off.

10. The tray for modules of claim 1, wherein:
   for a first state of the tray or modules, when the tray is connected to the motherboard, the display controller circuit is configured to apply a first display scheme, the first display scheme including activation of an indicator for a non-zero length of time;
   for a second state of the tray or modules, when the tray is connected to the motherboard, the display controller circuit is configured to apply a second display scheme, the second display scheme including activation of the indicator for a non-zero length of time;
   the first and second state are mutually exclusive;
   for the first state of the tray or modules, when the tray is disconnected from the motherboard, the display controller circuit is configured to apply a third display scheme, the third display scheme including constant deactivation of the indicator; and for the second state of the tray or modules, when the tray is disconnected from the motherboard, the display controller circuit is configured to apply a fourth display scheme, the fourth display scheme including activation of the indicator for a non-zero length of time.

11. The tray for modules of claim 1, wherein the display scheme applied by the display controller circuit when the tray is disconnected is fainter compared to the display scheme applied by the display controller circuit when the tray is connected.

12. The tray for modules of claim 1, wherein the display scheme applied by the display controller circuit when the tray is disconnected is configured to vary the brightness of an indicator according to a remaining power of the power storage circuit.

13. The tray for modules of claim 1, wherein the display scheme applied by the display controller circuit when the tray is disconnected is configured to vary periods of OFF for an indicator according to a remaining power of the power storage circuit.

14. The tray for modules of claim 1, wherein the display scheme applied by the display controller circuit when the tray is disconnected is configured to vary a burst time of an indicator according to a remaining power of the power storage circuit, wherein the burst time defines how long an indicator will be turned on once the indicator is turned on.

15. The tray for modules of claim 1, wherein the display scheme applied by the display controller circuit when the tray is disconnected is configured to vary a cycle time of an indicator according to a remaining power of the power storage circuit, wherein the cycle time defines a periodic basis for which an indicator will be turned on and off.

16. The tray for modules of claim 1, wherein the display scheme applied by the display controller circuit when the tray is disconnected is configured to cause an indicator to display a different color compared to when the tray is connected.

17. The tray for modules of claim 1, wherein the display scheme applied by the display controller circuit when the tray is disconnected is based upon a discrete supplied power value corresponding to available power.

18. The tray for modules of claim 1, wherein the display scheme applied by the display controller circuit when the tray is disconnected is based upon a linear formula from available power.

19. The tray for modules of claim 1, wherein the display scheme applied by the display controller circuit when the tray is disconnected is based upon a logarithmic formula from available power.

20. A baseboard management controller (BMC) system, comprising:
a tray slot configured to receive a tray, the tray to include a plurality of modules; and
a control circuit configured to:
detect whether the tray has been inserted into the tray slot;
detect any modules included in the tray;
retrieve tray identity data from a display control database based upon the tray and the modules;
detect insertion of a new module into the tray;
retrieve module identity data from the display control database for the new module and upon detection of the new module;
update a display controller circuit of the tray with retrieved tray identity data or retrieved module identity data;
obtain tray status conditions and module status conditions;
update the tray with determinations of tray status conditions and module status conditions;
provide the display controller circuit with display schemes for indicating the tray status conditions and module status conditions upon disconnection of the tray from the BMC system;
wherein the control circuit may cause output a tray status signal to a tray status indicator or output a module status signal to a module status indicator depending upon which status data has been retrieved.

21. The BMC system of claim 20, wherein the tray status signal indicates a state of the tray selected from: operating status of the at least one removable module, failure status of the at least one removable module, power communication status between the motherboard and the tray.

22. The BMC system of claim 20, wherein the at least one module status signal indicates a state of at least one removable module selected from: operating status, upgrade status, and failure status.

* * * * *